n(12) United States Patent
Liu et al.

(10) Patent No.: US 8,368,053 B2
(45) Date of Patent: Feb. 5, 2013

(54) MULTILAYER-INTERCONNECTION FIRST INTEGRATION SCHEME FOR GRAPHENE AND CARBON NANOTUBE TRANSISTOR BASED INTEGRATION

(75) Inventors: Zihong Liu, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 13/039,475

(22) Filed: Mar. 3, 2011

(65) Prior Publication Data
US 2012/0223292 A1 Sep. 6, 2012

(51) Int. Cl.
*H01L 29/06* (2006.01)
*H01L 21/336* (2006.01)

(52) U.S. Cl. ......................................... 257/24

(58) Field of Classification Search .................. 257/24, 257/E21.575–E21.597, E21.627, E21.641, 257/158, 621, 774, 700, 701, 640, E21.576, 257/E21.585, E21.59, E23.019, E23.145, 257/629; 977/734; 438/158
See application file for complete search history.

(56) References Cited

U.S. PATENT DOCUMENTS

| | | | |
|---|---|---|---|
| 6,972,467 B2 | 12/2005 | Zhang et al. | |
| 7,067,909 B2 * | 6/2006 | Reif et al. | 257/686 |
| 7,247,877 B2 | 7/2007 | Hakey et al. | |
| 2004/0152240 A1 | 8/2004 | Dangelo | |
| 2008/0217790 A1 * | 9/2008 | Hasunuma | 257/774 |
| 2009/0085135 A1 * | 4/2009 | Bang | 257/432 |
| 2009/0108318 A1 * | 4/2009 | Yoon et al. | 257/306 |
| 2009/0114903 A1 | 5/2009 | Kalburge | |
| 2009/0179193 A1 | 7/2009 | Appenzeller et al. | |
| 2009/0184311 A1 | 7/2009 | Steinberg | |
| 2009/0302394 A1 | 12/2009 | Fujita | |
| 2010/0001267 A1 | 1/2010 | Manning et al. | |
| 2010/0012925 A1 | 1/2010 | Bertin et al. | |
| 2010/0019310 A1 * | 1/2010 | Sakamoto | 257/324 |
| 2010/0051960 A1 | 3/2010 | Chen et al. | |
| 2011/0147939 A1 * | 6/2011 | La Tulipe et al. | 257/758 |
| 2011/0316069 A1 * | 12/2011 | Tanaka et al. | 257/324 |

OTHER PUBLICATIONS

J. Appenzeller et al., Carbon Nanotubes for High-Performance Electronics—Progress and Prospect, Proceedings of the IEEEE, vol. 96, No. 2, pp. 201-211 (Feb. 2008).
J. Baliga, "Chips go vertical, Looking for new ways to make ultrafast chips, designers explore the third dimension," IEEE Spectrum, vol. 41, No. 3, pp. 43-47 (Mar. 2004).
M. Zhang et al., "Novel local silicon-gate carbon nanotube transistors combining silicon-on-insulator technology for integration," IEEE Trans on Nanotech. vol. 8, No. 2, pp. 260-268 (Mar. 2009).

* cited by examiner

*Primary Examiner* — Dao H Nguyen
*Assistant Examiner* — Tram H Nguyen
(74) *Attorney, Agent, or Firm* — Vazken Alexanian; Michael. J. Chang, LLC

(57) ABSTRACT

Integrated circuit multilayer integration techniques are provided. In one aspect, a method of fabricating an integrated circuit is provided. The method includes the following steps. A substrate is provided. A plurality of interconnect layers are formed on the substrate arranged in a stack, each interconnect layer comprising one or more metal lines, wherein the metal lines in a given one of the interconnect layers are larger than the metal lines in the interconnect layers, if present, above the given interconnect layer in the stack and wherein the metal lines in the given interconnect layer are smaller than the metal lines in the interconnect layers, if present, below the given interconnect layer in the stack. At least one transistor is formed on a top-most layer of the stack.

17 Claims, 2 Drawing Sheets

US 8,368,053 B2

MULTILAYER-INTERCONNECTION FIRST INTEGRATION SCHEME FOR GRAPHENE AND CARBON NANOTUBE TRANSISTOR BASED INTEGRATION

FIELD OF THE INVENTION

The present invention relates to integrated circuits, and more particularly, to techniques for multilayer integration of graphene and carbon nanotube-based integrated circuits.

BACKGROUND OF THE INVENTION

Multilayer interconnection is required for medium/large scale integrated circuits. Traditional silicon metal oxide semiconductor field effect transistor (MOSFET) integrated circuits are typically based on a structure where active transistor devices are fabricated first, followed by back-end processing including multilayer metal interconnection line deposition. This integration scheme is ideal for traditional semiconductor transistors with top-gated structures and channel material which is intrinsically grown from the substrate wafer.

However, for semiconductor materials such as graphene- or carbon nanotube-based transistors, additional factors need to be considered when developing an integration scheme. First, in most cases, the graphene or carbon nanotubes are extrinsically deposited onto the substrate, and thus a bottom-gated structure is employed to render simpler processing and higher flexibility for semiconductor-dielectric interface engineering. Second, graphene and carbon nanotubes are very susceptible to damage and contamination from exposure to further processing. Thus, with graphene- or carbon nanotube-based devices it is desirable to minimize the exposure of the devices to subsequent processing.

Therefore, MOSFET integrated circuit fabrication techniques that are suitable for use with graphene- or carbon nanotube-based transistors, i.e., are compatible with both top- and bottom-gated devices and isolate the devices from processing damage and contamination, would be desirable.

SUMMARY OF THE INVENTION

The present invention provides integrated circuit multilayer integration techniques. In one aspect of the invention, a method of fabricating an integrated circuit is provided. The method includes the following steps. A substrate is provided. A plurality of interconnect layers are formed on the substrate arranged in a stack, each interconnect layer comprising one or more metal lines, wherein the metal lines in a given one of the interconnect layers are larger than the metal lines in the interconnect layers, if present, above the given interconnect layer in the stack and wherein the metal lines in the given interconnect layer are smaller than the metal lines in the interconnect layers, if present, below the given interconnect layer in the stack. At least one transistor is formed on a top-most layer of the stack.

In another aspect of the invention, an integrated circuit is provided. The integrated circuit includes a substrate; a plurality of interconnect layers on the substrate arranged in a stack, each interconnect layer comprising one or more metal lines, wherein the metal lines in a given one of the interconnect layers are larger than the metal lines in the interconnect layers, if present, above the given interconnect layer in the stack and wherein the metal lines in the given interconnect layer are smaller than the metal lines in the interconnect layers, if present, below the given interconnect layer in the stack; and at least one transistor on a top-most layer of the stack.

A more complete understanding of the present invention, as well as further features and advantages of the present invention, will be obtained by reference to the following detailed description and drawings.

DETAILED DESCRIPTION OF PREFERRED EMBODIMENTS

Figure 1:
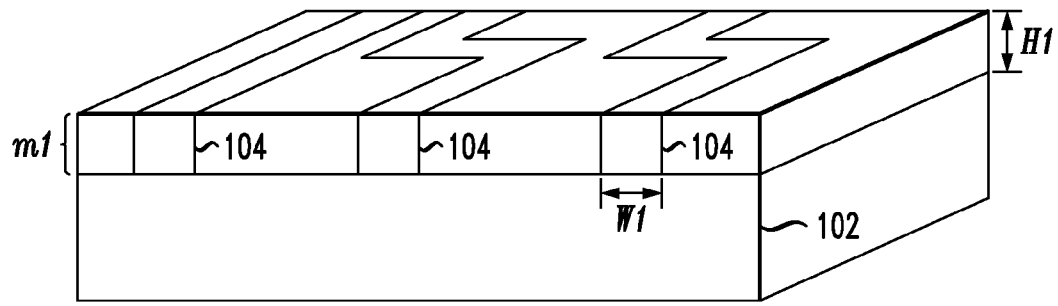
FIG. 1 is a diagram showing a cross-sectional cut through a three-dimensional representation of an integrated circuit illustrating a first metal interconnect carrier layer m1 with metal lines having been formed on a substrate according to an embodiment of the present invention.

Provided herein is a new integration scheme and circuit structure for graphene and carbon nanotube transistor-based integrated circuits to circumvent the problems described above. FIGS. 1-5 are diagrams illustrating an exemplary methodology for fabricating an integrated circuit. Each of FIGS. 1-5 depict a cross-sectional cut through a three-dimensional representation of the integrated circuit structure. As shown in FIG. 1, a substrate 102 is provided and a first metal interconnect carrier layer (labeled m1) (also referred to herein as "an interconnect layer") is formed on substrate 102. Substrate 102 can be made of glass, metal, plastic, a semiconductor material (such as a bulk silicon substrate) or any other type of suitable substrate material.

Conventional processes may be employed to fabricate the first metal interconnect carrier layer on substrate 102. According to an exemplary embodiment, the first metal interconnect carrier layer contains a plurality of metal lines 104. In this example, the first metal interconnect carrier layer is formed by first depositing a layer of an insulating material, such as a layer of an oxide (e.g., silicon dioxide), on the substrate and then patterning the insulating layer with the footprint and location of metal lines 104. The pattern is then filled with a metal(s), such as copper, to form metal lines 104.

The metal overfill may be polished to planarize the first metal interconnect carrier layer and provide a flat surface upon which subsequent via/metal interconnect carrier layers (as described below) or transistors can be fabricated. The configuration of the metal lines 104, i.e., shape, orientation, number, etc., shown in FIG. 1 is merely exemplary and any application-specific metal line configuration can be implemented in accordance with the present techniques.

In this particular example, additional metal interconnect carrier layers will be fabricated on top of the first metal interconnect carrier layer so as to form a stack of layers. One or more transistors will then be fabricated on top of the highest layer in the stack. Each metal interconnect carrier layer will contain metal lines. The metal lines in any given one of the layers will be larger than the metal lines in any of the other layers above that given layer in the stack. Also, the metal lines in the given layer will be smaller than the metal lines in any of the other layers below that given layer in the stack. Now if the given layer is the top layer in the stack then of course there would be no layers above that given layer in the stack and only the second condition above, i.e., that the metal lines in the given layer will be smaller than the metal lines in any of the other layers below that given layer in the stack, would apply. Conversely, if the given layer is the bottom layer in the stack, there would be no layer below that given layer in the stack and only the first condition above, i.e., that the metal lines in the given layer will be larger than the metal lines in any of the other layers above that given layer in the stack, would apply. Since the stack contains multiple metal interconnect carrier layers, then at least one of the above conditions always applies. If the given metal interconnect carrier layer is present within the stack, i.e., if one or more metal interconnect carrier layers are present both above and below the given metal interconnect carrier layer in the stack, then both of the above conditions would apply.

A convenient way to quantify metal line size is by the cross-sectional area of the lines. Cross-sectional area can be measured as a function of cross-sectional width W and cross-sectional height H. See, for example, FIG. 1. Specifically, cross-sectional area can be quantified as the product of the cross-sectional width and the cross-sectional height. Thus, in this example, the metal lines in any given one of the layers will 1) have a cross-sectional area that is greater than a cross-sectional area of the metal lines in the interconnect layers, if any (i.e., the given interconnect layer might be the top layer in the stack, see above), that are present above the given interconnect layer in the stack and/or 2) the metal lines in the given interconnect layer will have a cross-sectional area that is less than a cross-sectional area of the metal lines in the interconnect layers, if any (i.e., the given interconnect layer might be the bottom layer in the stack, see above), that are present below the given interconnect layer in the stack. As described above, both conditions 1 and 2 would apply if the given interconnect layer is present within the stack, i.e., has interconnect layers both above and below it in the stack. This tapering of the metal line size moving up the stack will minimize delay and ensure that the transistors will operate at an optimal, fast speed. Namely, for very large scale integrated (VLSI) circuits, for example, multilayer interconnection is needed. VLSI delay optimization demands wiring size distribution with the biggest metal line being situated farthest from the active transistor device(s), and the smaller metal line being situated closer to the devices. The present techniques can be used to produce integrated circuit designs that conform to these specifications.

Some variation in the dimensions of the metal lines may occur during fabrication. This is in some instances unavoidable. For example, the cross-sectional dimensions (e.g., cross-sectional width, cross-sectional height and resulting cross-sectional area) of a given one of metal lines 104 may differ slightly from the cross-sectional dimensions of the other metal lines 104 and/or the cross-sectional dimensions of a cut through one portion of one of metal lines 104 may differ slightly from a cut through a different portion of the same metal line. Regardless, what is important is that the metal lines in any given one of the layers will overall be larger (i.e., the minimum size (for example the minimum cross-sectional area) of the metal lines will still be larger) than the metal lines in any of the other layers above that given layer in the stack. Similarly, the metal lines in the given layer will overall be smaller (i.e., the maximum size (for example the maximum cross-sectional area) of the metal lines will still be smaller) than the metal lines in any of the other layers below that given layer in the stack.

It is notable that the present scheme for tapering the metal line size moving up the stack of interconnect layers is intended to be implemented within a single integrated circuit, rather than for example across an entire wafer. It is to be expected that a given wafer might have different circuit configurations present, each configuration using a different interconnect scheme for each of the circuits on the wafer. However, the present techniques are directed to implementing this bottom to top tapered interconnect layer design for one or more of the individual circuits on the wafer, in a circuit-by-circuit basis.

Figure 2:
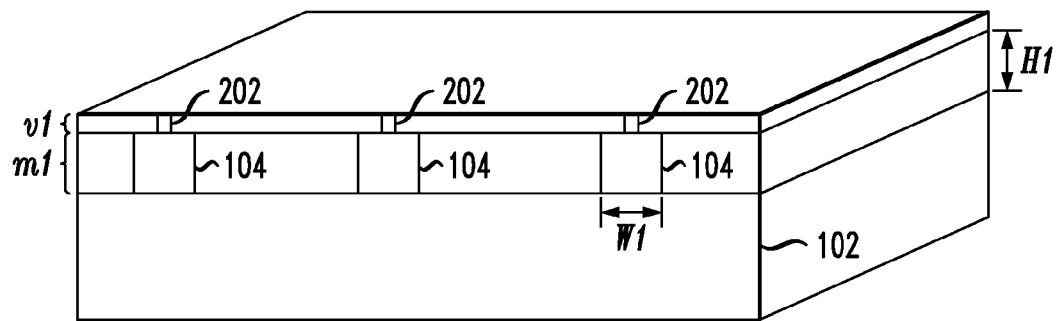
FIG. 2 is a diagram showing a cross-sectional cut through a three-dimensional representation of the integrated circuit illustrating a first layer v1 of vias having been formed on the first metal interconnect carrier layer according to an embodiment of the present invention.

According to an exemplary embodiment, the metal interconnect carrier layers in the stack are separated from one another by a layer containing one or more vias extending therethrough. For example, FIG. 2 is a diagram showing a cross-sectional cut through a three-dimensional representation of the integrated circuit illustrating a first layer v1 of conductive vias 202 having been formed on the first metal interconnect carrier layer. Any conventional process may be employed to fabricate the layer of conductive vias. By way of example only, layer v1 may be formed by first depositing a layer of an insulating material, such as a layer of an oxide (e.g., silicon dioxide), on the substrate and then patterning a plurality of vias in the insulating layer with the footprint and location of conductive vias 202. The vias are then filled with a metal(s), such as copper, to form conductive vias 202. The metal overfill may be polished to planarize the layer. The configuration of the vias 202, i.e., shape, size, orientation, number, etc., shown in FIG. 2 is merely exemplary and any application-specific via configuration can be implemented in accordance with the present techniques. The layer(s) of vias serve to connect (integrate) the interconnect layers.

Figure 3:
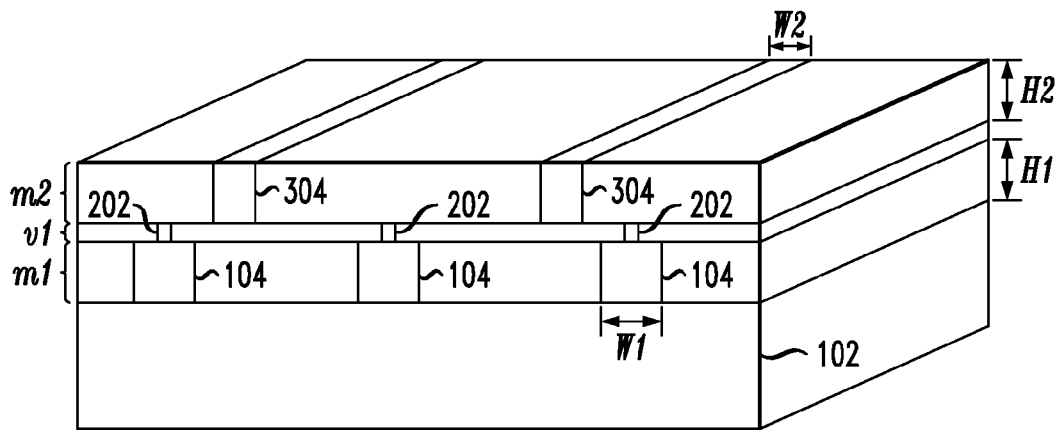
FIG. 3 is a diagram showing a cross-sectional cut through a three-dimensional representation of the integrated circuit illustrating a second metal interconnect carrier layer m2 with metal lines having been formed on the first layer v1 of vias according to an embodiment of the present invention.

FIG. 3 is a diagram showing a cross-sectional cut through a three-dimensional representation of the integrated circuit illustrating a second metal interconnect carrier layer m2 with metal lines 304 having been formed on the first layer v1 of vias. As with the first metal interconnect carrier layer, the second metal interconnect carrier layer contains a plurality of metal lines, in this case metal lines 304. The second metal interconnect carrier layer can be formed by first depositing a layer of an insulating material, such as a layer of an oxide (e.g., silicon dioxide), on the first layer v1 of vias and then patterning the insulating layer with the footprint and location of metal lines 304. The pattern is then filled with a metal(s), such as copper, to form metal lines 304. The metal overfill may be polished to planarize the second metal interconnect carrier layer and provide a flat surface upon which subsequent via/metal interconnect carrier layers (as described below) or transistors can be fabricated. The configuration of the metal lines 304, i.e., shape, orientation, number, etc., shown in FIG.

3 is merely exemplary and any application-specific metal line configuration can be implemented in accordance with the present techniques.

As highlighted above, it is preferable that the metal lines in any given one of the metal interconnect carrier layers will be larger (e.g., have a larger cross-sectional area) than the metal lines in any of the other layers above that given layer in the stack and/or the metal lines in the given layer will be smaller (e.g., have a smaller cross-sectional area) than the metal lines in any of the other layers below that given layer in the stack. Cross-sectional area can be quantified as the product of the cross-sectional width W and the cross-sectional height H of each of the metal lines. Thus, according to an exemplary embodiment, the metal lines in the first metal interconnect carrier layer will have a cross-sectional width W1 and cross-sectional height H1 (see FIG. 1), and the metal lines in the second metal interconnect carrier layer will have a cross-sectional width W2 and cross-sectional height H2, wherein W1 is greater than W2. While cross-sectional height H1 may be greater than cross-sectional height H2, this is not necessary, as the increase in cross-sectional area may be achieved simply by increasing the cross-sectional width while maintaining the same cross-sectional height. Thus, in one exemplary embodiment, W1 is greater than W2 and H1 is equal to H2.

As highlighted above, some variation in the dimensions of the metal lines may occur during fabrication. In this instance, what is important is that the metal lines in any given one of the layers will overall be larger (i.e., the minimum size (for example the minimum cross-sectional area) of the metal lines will still be larger) than the metal lines in any of the other layers above that given layer in the stack. Similarly, the metal lines in the given layer will overall be smaller (i.e., the maximum size (for example the maximum cross-sectional area) of the metal lines will still be smaller) than the metal lines in any of the other layers below that given layer in the stack.

Figure 4:
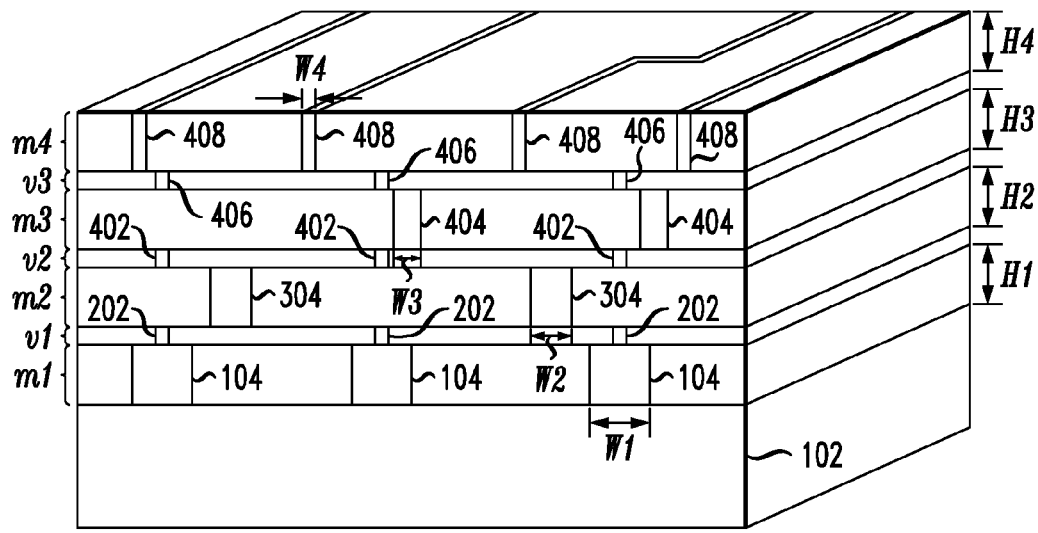
FIG. 4 is a diagram showing a cross-sectional cut through a three-dimensional representation of the integrated circuit illustrating a second layer of vias v2 having been formed on the second metal interconnect carrier layer m2, a third metal interconnect carrier layer m3 having been formed on via layer v2, a third layer of vias v3 having been formed on the third metal interconnect carrier layer m3 and a fourth metal interconnect carrier layer m4 having been formed on via layer v3 according to an embodiment of the present invention.

The steps used to form the first and second metal interconnect carrier layers can be used to form additional interconnect carrier layers on the stack. The number of interconnect layers will be determined by the circuit design specifications. The optimal number of interconnect layers could lead to a minimum signal delay in the circuit. By way of example only, FIG. 4 shows two additional metal interconnect carrier layers m3 and m4 separated by two additional layers of vias v2 and v3 having been formed on the stack, i.e., a second layer of vias v2 having been formed on the second metal interconnect carrier layer m2, a third metal interconnect carrier layer m3 having been formed on via layer v2, a third layer of vias v3 having been formed on the third metal interconnect carrier layer m3 and a fourth metal interconnect carrier layer m4 having been formed on via layer v3.

Each of the second and third layers of vias also contain a plurality of conductive vias, in this case conductive vias 402 and 406, respectively, and each of the third and fourth metal interconnect carrier layers also contain a plurality of metal lines, in this case metal lines 404 and 408, respectively. In keeping with the preferred configuration wherein the metal lines in any given one of the metal interconnect carrier layers are larger (e.g., have a larger cross-sectional area) than the metal lines in any of the other layers above that given layer in the stack and/or the metal lines in the given layer will be smaller (e.g., have a smaller cross-sectional area) than the metal lines in any of the other layers below that given layer in the stack, and wherein cross-sectional area is quantified as the product of the cross-sectional width W and the cross-sectional height H of each of the metal lines, the metal lines in the third metal interconnect carrier layer have a cross-sectional width W3 and cross-sectional height H3, and the metal lines in the fourth metal interconnect carrier layer have a cross-sectional width W4 and cross-sectional height H4, wherein W2 (the cross-sectional width of the metal lines in the second metal interconnect carrier layer) is greater than W3, and W3 is greater than W4. While H2 (the cross-sectional height of the metal lines in the second metal interconnect carrier layer) may be greater than H3, and H3 may be greater than H4, this is not necessary, as the increase in cross-sectional area may be achieved simply by increasing the cross-sectional width while maintaining the same cross-sectional height. Thus, in one exemplary embodiment, W2 is greater than W3 and W3 is greater than W4, while H2, H3 and H4 are all equal.

As highlighted above, some variation in the dimensions of the lines may occur during fabrication. In this instance, what is important is that the metal lines in any given one of the layers will overall be larger (i.e., the minimum size (for example the minimum cross-sectional area) of the metal lines will still be larger) than the metal lines in any of the other layers above that given layer in the stack. Similarly, the metal lines in the given layer will overall be smaller (i.e., the maximum size (for example the maximum cross-sectional area) of the metal lines will still be smaller) than the metal lines in any of the other layers below that given layer in the stack.

The second layer of vias v2 can be formed by first depositing a layer of an insulating material, such as a layer of an oxide (e.g., silicon dioxide), on the second metal interconnect carrier layer m2 and then patterning a plurality of vias in the insulating layer with the footprint and location of conductive vias 402. The vias are then filled with a metal(s), such as copper, to form conductive vias 402. The metal overfill may be polished to planarize the layer. The configuration of the vias 402, i.e., shape, size, orientation, number, etc., shown in FIG. 4 is merely exemplary and any application-specific via configuration can be implemented in accordance with the present techniques.

The third metal interconnect carrier layer m3 can be formed by first depositing a layer of an insulating material, such as a layer of an oxide (e.g., silicon dioxide), on the via layer v2 and then patterning the insulating layer with the footprint and location of metal lines 404. The pattern is then filled with a metal(s), such as copper, to form metal lines 404. The metal overfill may be polished to planarize the first metal layer and provide a flat surface. The configuration of the metal lines 404, i.e., shape, orientation, number, etc., shown in FIG. 4 is merely exemplary and any application-specific metal line configuration can be implemented in accordance with the present techniques.

The third layer of vias v3 can be formed by first depositing a layer of an insulating material, such as a layer of an oxide (e.g., silicon dioxide), on the third metal interconnect carrier layer m3 and then patterning a plurality of vias in the insulating layer with the footprint and location of conductive vias 406. The vias are then filled with a metal(s), such as copper, to form conductive vias 406. The metal overfill may be polished to planarize the layer. The configuration of the vias 406, i.e., shape, size, orientation, number, etc., shown in FIG. 4 is merely exemplary and any application-specific via configuration can be implemented in accordance with the present techniques.

The fourth metal interconnect carrier layer m4 can be formed by first depositing a layer of an insulating material, such as a layer of an oxide (e.g., silicon dioxide), on via layer v3 and then patterning the insulating layer with the footprint and location of metal lines 408. The pattern is then filled with a metal(s), such as copper, to form metal lines 408. The metal overfill may be polished to planarize the first metal layer and provide a flat surface. The configuration of the metal lines 408, i.e., shape, orientation, number, etc., shown in FIG. 4 is merely exemplary and any application-specific metal line configuration can be implemented in accordance with the present techniques.

Figure 5:
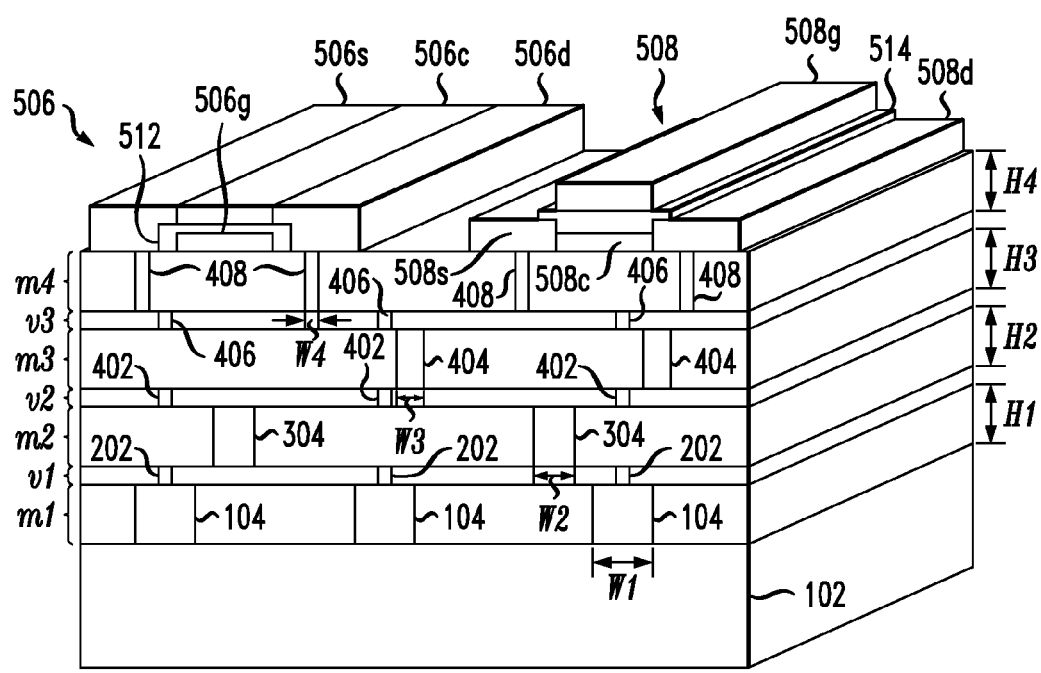
FIG. 5 is a diagram showing a cross-sectional cut through a three-dimensional representation of the integrated circuit illustrating both a bottom-gated carbon material-based transistor and a top-gated carbon material-based transistor having been formed on the fourth metal interconnect carrier layer according to an embodiment of the present invention.

One or more transistors can be formed on the top-most metal interconnect carrier layer in the stack (in this case on the fourth metal interconnect carrier layer). Advantageously, the present techniques are compatible with more traditional top-gated transistor structures as well as the bottom-gated transistor structures often employed for carbon material-based (i.e., graphene or carbon nanotube-based) devices. To illustrate the versatility of the process, both a bottom-gated transistor 506 and a top-gated transistor 508 are shown in FIG. 5 having been formed on the fourth metal interconnect carrier layer m4. Of course, in practice, the particular type/number of transistors formed will vary depending on the particular application at hand.

To form a bottom-gated transistor, such as transistor 506, a gate material is first deposited onto the given substrate. In this case the substrate is the fourth metal interconnect carrier layer. Any suitable gate materials, e.g., a metal(s) or doped polysilicon, may be employed. Lithography and etching processes are then used to form, i.e., pattern, a bottom gate 506g on the top metal interconnect carrier layer.

A dielectric material 512 is then deposited over bottom gate 506g. This will serve as the gate dielectric. A carbon-based material is then formed on the gate dielectric. The carbon-based material will serve as a channel 506c of the transistor According to an exemplary embodiment, the carbon-based material is graphene and/or carbon nanotubes. By way of example only, graphene can be deposited on the gate dielectric using a transfer process, such as exfoliation. Carbon nanotubes can be deposited, for example, from a solution using a spin on process.

In this manner, a minimal amount of processing is performed once the carbon-based material has been formed. Therefore, the potential for contamination to the graphene or carbon nanotube material is minimal. By contrast, with conventional fabrication processes the transistors are formed first followed by the metal interconnect carrier layers. During the subsequent formation of the metal interconnect carrier layers, contamination of the graphene/carbon nanotube materials is difficult to avoid.

Source and drain regions 506s and 506d, respectively, are then formed in contact with the carbon-based material. Source and drain regions 506s and 506d can be formed using conventional processes. By way of example only, source and drain regions 506s and 506d can be formed using conventional metal deposition and lithography patterning techniques.

To form a top-gated transistor, such as transistor 508, a carbon-based material is first formed on the given substrate. In this case the substrate is the fourth metal interconnect carrier layer. According to an exemplary embodiment, the carbon-based material is graphene and/or carbon nanotubes which can be deposited on the metal interconnect carrier layer, e.g., by exfoliation or from a solution (using a spin-on process), respectively. The carbon-based material will serve as a channel 508c of the transistor. A dielectric material 514 is then deposited over channel 508c which will serve as the gate dielectric.

A gate material is then deposited onto the gate dielectric. Any suitable gate materials, e.g., a metal(s) or doped polysilicon, may be employed. Lithography and etching processes are then used to form, i.e., pattern, a top gate 508g. In this manner, top gate 508g will be separated from channel 508c by the gate dielectric.

In this manner, a minimal amount of processing is performed once the carbon-based material has been formed. Therefore, the potential for contamination to the graphene or carbon nanotube material is minimal. By contrast, with conventional fabrication processes the transistors are formed first followed by the metal interconnect carrier layers. During the subsequent formation of the metal interconnect carrier layers, contamination of the graphene/carbon nanotube materials is difficult to avoid.

Source and drain regions 508s and 508d, respectively, are then formed in contact with the carbon-based material. Source and drain regions 508s and 508d can be formed using conventional processes. By way of example only, source and drain regions 508s and 508d can be formed using conventional metal deposition and lithography patterning techniques.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating an integrated circuit, comprising the steps of:
    providing a substrate;
    forming a plurality of interconnect layers on the substrate arranged in a stack,
    each interconnect layer comprising one or more metal lines, wherein the metal lines in a given one of the interconnect layers are larger than the metal lines in the interconnect layers, if present, above the given interconnect layer in the stack and wherein the metal lines in the given interconnect layer are smaller than the metal lines in the interconnect layers, if present, below the given interconnect layer in the stack;
    forming at least one transistor on a top-most layer of the stack; and
    forming a layer of conductive vias between each interconnect layer in the stack.

2. The method of claim 1, wherein the metal lines in the given interconnect layer have a cross-sectional area that is greater than a cross-sectional area of the metal lines in the interconnect layers, if any, that are present above the given interconnect layer in the stack and wherein the cross-sectional area of the metal lines in the given interconnect layer is less than a cross-sectional area of the metal lines in the interconnect layers, if any, that are present below the given interconnect layer in the stack.

3. The method of claim 1, wherein the substrate comprises glass, metal, plastic, a semiconductor material or a bulk silicon substrate.

4. The method of claim 1, wherein the step of forming the transistor comprises the steps of:
    forming a bottom gate on the stack;
    depositing a gate dielectric material over the bottom gate;
    forming a carbon-based material on the gate dielectric material which serves as a channel of the transistor; and
    forming source and drain regions in contact with the carbon-based material.

5. The method of claim 4, wherein the carbon-based material comprises graphene.

6. The method of claim 4, wherein the carbon-based material comprises carbon nanotubes.

7. The method of claim 1, wherein the step of forming the transistor comprises the steps of:
- forming a carbon-based material on the stack which serves as a channel of the transistor;
- depositing a gate dielectric material over the carbon-based material;
- forming a top gate separated from the carbon-based material by the gate dielectric material; and
- forming source and drain regions in contact with the carbon-based material.

8. The method of claim 7, wherein the carbon-based material comprises graphene.

9. The method of claim 7, wherein the carbon-based material comprises carbon nanotubes.

10. An integrated circuit, comprising:
- a substrate;
- a plurality of interconnect layers on the substrate arranged in a stack, each interconnect layer comprising one or more metal lines, wherein the metal lines in a given one of the interconnect layers are larger than the metal lines in the interconnect layers, if present, above the given interconnect layer in the stack and wherein the metal lines in the given interconnect layer are smaller than the metal lines in the interconnect layers, if present, below the given interconnect layer in the stack;
- at least one transistor on a top-most layer of the stack; and
- a layer of conductive vias between each interconnect layer in the stack.

11. The integrated circuit of claim 10, wherein the substrate comprises glass, metal, plastic, a semiconductor material or a bulk silicon substrate.

12. The integrated circuit of claim 10, wherein the transistor comprises:
- a bottom gate on the stack;
- a gate dielectric material disposed over the bottom gate;
- a carbon-based material on the gate dielectric material which serves as a channel of the transistor; and
- source and drain regions in contact with the carbon-based material.

13. The integrated circuit of claim 12, wherein the carbon-based material comprises graphene.

14. The integrated circuit of claim 12, wherein the carbon-based material comprises carbon nanotubes.

15. The integrated circuit of claim 10, wherein the transistor comprises:
- a carbon-based material on the stack which serves as a channel of the transistor;
- a gate dielectric material over the carbon-based material;
- a top gate separated from the carbon-based material by the gate dielectric; and
- source and drain regions in contact with the carbon-based material.

16. The integrated circuit of claim 15, wherein the carbon-based material comprises graphene.

17. The integrated circuit of claim 15, wherein the carbon-based material comprises carbon nanotubes.

* * * * *